United States Patent [19]

Matsuda et al.

[11] Patent Number: 5,679,610

[45] Date of Patent: Oct. 21, 1997

[54] METHOD OF PLANARIZING A SEMICONDUCTOR WORKPIECE SURFACE

[75] Inventors: Tetsuo Matsuda; Katsuya Okumura, both of Poughkeepsie, N.Y.

[73] Assignee: Kabushiki Kaisha Toshiba, Kawasaki, Japan

[21] Appl. No.: 356,541

[22] Filed: Dec. 15, 1994

[51] Int. Cl.$^6$ ............................................. H01L 21/31
[52] U.S. Cl. ................... 437/225; 437/231; 437/238; 437/235; 437/240; 437/245; 437/249
[58] Field of Search ...................... 437/231, 238, 437/241, 235, 225, 245, 249, 240

[56] References Cited

U.S. PATENT DOCUMENTS

| | | |
|---|---|---|
| 4,609,139 | 9/1986 | Hawrylo . |
| 4,676,868 | 6/1987 | Riley et al. . |
| 4,758,533 | 7/1988 | Magee et al. . |
| 4,909,693 | 3/1990 | Augros ............................. 412/8 |
| 4,963,221 | 10/1990 | Isobe et al. . |
| 5,034,801 | 7/1991 | Fischer . |
| 5,078,820 | 1/1992 | Hamamura et al. . |
| 5,104,828 | 4/1992 | Morimoto et al. . |
| 5,106,779 | 4/1992 | Yu . |
| 5,164,323 | 11/1992 | Brehm et al. ...................... 437/10 |
| 5,173,766 | 12/1992 | Long et al. . |
| 5,257,478 | 11/1993 | Hyde et al. . |
| 5,285,102 | 2/1994 | Ying . |
| 5,286,329 | 2/1994 | Iijima et al. . |
| 5,318,663 | 6/1994 | Buti et al. ...................... 156/636 |
| 5,371,943 | 12/1994 | Shibata ........................... 29/827 |
| 5,434,107 | 7/1995 | Paranjpe .......................... 437/225 |
| 5,580,827 | 12/1996 | Akamine ........................... 437/249 |

FOREIGN PATENT DOCUMENTS

| | | | |
|---|---|---|---|
| 62-046533 | 2/1987 | Japan | .............. H01L 21/316 |
| 4111454 | 4/1992 | Japan | .............. H01L 23/38 |

OTHER PUBLICATIONS

Wolf, Stanley "Silicon Processing for the VLSI Era", vol. 2, Lattice Press, CA, (1990), pp. 31–32.

*Planarization Techniques* Semiconductor International, Apr. 1988, pp. 115–119.

Peter Van Zant, Microchip Fabrication (2d. edition), pp. 85–103; 161–256, ©1990.

J.A. Prybyla and G.N. Taylor, "New Method of Global Planarization for Si ULSI", 1994 Symposium on VLSI Technology—Digest of Technical Papers, pp. 75–76.

*Primary Examiner*—Charles L. Bowers, Jr.
*Assistant Examiner*—Matthew Whipple
*Attorney, Agent, or Firm*—Banner & Witcoff, Ltd.

[57] ABSTRACT

The present invention relates to a simple, low cost planarization technique whereby physical pressure is used to planarize the surface of a semiconductor device. The method of the present invention planarizes a semiconductor workpiece surface and results in an increase in the productivity of the processing steps that follow. In effect, the present invention applies physical pressure to flatten the surface layers of a semiconductor workpiece. The present invention is particularly adapted for use in planarizing surface layers made of plastic materials.

31 Claims, 6 Drawing Sheets

5,679,610

METHOD OF PLANARIZING A SEMICONDUCTOR WORKPIECE SURFACE

BACKGROUND OF THE INVENTION

1. Field of the Invention

The present invention pertains to semiconductor processing. More particularly, the present invention is directed to a method of planarizing a semiconductor workpiece surface. The disclosed planarization method is particularly adapted for use with a semiconductor wafer used in the manufacture of integrated circuits.

2. Description of the Prior Art

As taught in Chapters 5 and 8–10 of "Microchip Fabrication" by Peter Van Zant (©1990), wafer fabrication is the series of processes used to create semiconductor devices in and on the surface of a wafer formed most commonly from silicon. In wafer fabrication, a plurality of devices such as integrated circuits or chips are imprinted on a single prepared wafer. Each device carries multiple thin layers of conductors, semiconductors, and insulators.

Wafer fabrication may be used to produce chips with thousands of different functions and designs. The designs of the devices and circuits are based on a number of different transistor structures. Bipolar and MOS transistors are the major structure designs, but numerous variations of them exist. Additionally, a variety of processes and materials may be used to create the individual layers of any particular structure. In general, however, four basic operations are performed on a wafer during the fabrication process: layering, patterning, doping, and heat treating. During fabrication, a plurality of layers are applied, patterned, doped and heat treated to create the finished chip.

Briefly, layering is the operation used to add thin layers to the wafer surface. These layers are either conductors, semiconductors, or insulators. These layers are of differing materials and are grown or deposited by a variety of techniques. Oxidation, for example, is a technique of growing a silicon dioxide layer on a silicon wafer. Common deposition techniques are chemical vapor deposition (CVD), evaporation, and sputtering.

The patterning process creates the surface parts of the devices that make up a circuit. Patterning is the series of steps that results in the removal of selected portions of the surface layers added to the wafer surface. After removal, a pattern of the layer is left on the wafer surface. The material removed may be in the form of a hole in the layer or just a remaining island of the material. The patterning process is commonly known as photolithography, photomasking, masking, and microlithography. Photolithographic patterning is a multi-step pattern transfer process similar to stenciling or photography. In photolithography, the required pattern is first formed in reticles or photomasks and transferred into the surface layers of the wafer through the photomasking steps. The transfer takes place in two stages. First, the pattern on the reticle or mask is transferred into a layer of photoresist. Photoresist is a light-sensitive material similar to the coating on a regular photographic film. It changes its structure and properties when exposed to light. Negative photoresists undergo polymerization, changing from a soluble condition to an insoluble one. Removing the soluble portion with chemical solvents, or developers, leaves a hole in the resist layer that corresponds to the opaque pattern on the reticle. The second transfer stage takes place from the photoresist layer into the wafer surface layer. The etch-resistant photoresist does not dissolve in applied chemical etching solution, and the transfer occurs when the wafer etchants remove the portion of the wafer's top layer that is not covered with photoresist. While the use of negative photoresists has been described hereinabove, positive-acting photoresists have also been used in photolithographic processes.

Because the above-described patterning process sets the horizontal dimensions on the various parts of the devices and circuits, patterning is the most critical of the four basic operations in semiconductor wafer processing. Errors in the patterning process can cause distorted or misplaced patterns that result in changes in the electrical functioning of the device or circuit. Planarization is necessary to improve both photolithographic feature resolution and dimension control and to alleviate metallization discontinuity which may result from abrupt changes in topography. Global planarization of the wafer surface is thus necessary to ensure that the next processing step performed on the workpiece is effective.

The advancement of circuits to very-large scale integration (VLSI) levels has created problems in this regard. VLSI technology has required the addition of countless more layers to the wafer surface. These layers have in turn created more steps on the wafer surface as shown in FIG. 1. In FIG. 1, a conventional semiconductor workpiece 10 undergoing the patterning process is shown. The workpiece 10 is comprised of a substrate 12 with a metal layer 14 and a resist layer 16 applied thereto. The incident radiation is shown generally by the arrows at 18 impinging upon the mask 19. As shown by FIG. 1, the greater number of steps on the wafer surface have made the resolution of small image sizes more difficult due to light reflection and the thinning of resist layers over the steps. A number of techniques have been used in the prior art to offset the effects of a varied wafer topography.

Manufacturers have attempted to use a variety of techniques to globally planarize the surface of a semiconductor workpiece. Individual layers are sometimes simply polished and cleaned using conventional means during fabrication to ensure that a planar surface is provided for the next applied surface layer. In addition, chemical-mechanical planarization (CMP), multi-layer resist processing, polyimide planarization layers, etch-back, and reflow processes have all been used in the past.

CMP is a combination of mechanical and chemical abrasion, and may be performed with an acidic or basic slurry. Material is removed from the surface of a wafer due to both the mechanical buffing action of a polishing pad and the action of the acid or base. However, CMP processes may adversely affect the final thickness of the surface layer of a semiconductor workpiece, which must be maintained within a very narrow tolerance window. In addition, CMP methods are prone to dishing of the wafer surface due to deformation of the polishing pad.

Multi-layer resists, polyimide planarization layers, and reflow techniques are all described at pages 247–251 of Van Zant's "Microchip Fabrication". Multilayer resist processes are suited to resolve small geometries on wafers with a varied topography. Both dual layer and tri-layer resist processes have been used. First a relatively thick layer of resist is applied and baked to the thermal flow point. The goal is a planar top resist surface. A typical process uses a positive-acting polymethylmeth acrylate (PMMA) resist sensitive to deep ultraviolet radiation. Next, a thin layer of positive resist sensitive to just ultraviolet radiation is spun on top of the first layer and processed through the development step. The thin top layer allows the resolution of the pattern without the adverse effects encountered with thick resist layers or reflections from steps in the surface. This top layer of resist acts as a radiation block, leaving the bottom layer unpatterned. Next, the wafer is given a blanket or flood of deep ultraviolet exposure, which exposes the underlying positive resist through the holes in the top layer, thus extending the pattern down to the wafer surface. A development step completes the hole resolution and the wafer is ready for etch. While suitable in some cases, multi-layer resists are not entirely suitable for all wafer fabrication processes. In general, multilayer resist processes are time-intensive and require a number of yield-limiting steps.

Polyimides offer the dielectric strength of deposited silicon dioxide films and the process advantage of application to the wafer with the same spinning equipment used for photoresist. Once applied to the wafer, the polyimides flow over the surface, making it more planar. After application and flow, the polyimide can be covered with a hard layer and patterned with chemicals much like a photoresist. A popular use of polyimide layers is as an interdielectric layer between two layers of conducting metal.

Reflow involves heating the wafer to a very high temperature in order to cause an insulating layer to flow and become level. A hard planarizing layer or layers is thus added to the wafer surface. A popular reflow planarization layer is a boron silicate glass (BSG), which is deposited silicon dioxide doped with boron. The presence of the boron causes the glass to flow at a relatively low temperature. Another hard planarizing layer used is spin-on-glass (SOG). SOG is a mixture of silicon dioxide in a solvent that evaporates quickly. After spin application the glass film is baked, leaving a planarized silicon dioxide film.

Etch-back involves the deposition of a sacrificial leveling layer, such as photoresist, to fill the voids and crevices which are present following application of a surface layer. The flat surface created by the sacrificial layer is then etched back at a uniform rate to leave a generally flat layer of insulating material having a desired thickness. Etch-back of the sacrificial layer has been achieved with ion beam erosion and with high frequency low pressure batch plasma etching. Additional etch-back techniques are discussed in U.S. Pat. No. 4,676,868. Etchback techniques are often time consuming, and batch processing may result in a lack of uniformity in the planarization across individual wafers. In addition, the use of a sacrificial etch-back layer may adversely affect the final thickness of the surface layer of a semiconductor workpiece, which must be maintained within a very narrow tolerance window.

SUMMARY OF THE INVENTION

The present invention relates to a simple, low cost planarization technique whereby physical pressure is used to planarize the surface of a semiconductor device. The method of the present invention planarizes a semiconductor workpiece surface and results in an increase in the productivity of the processing steps that follow. In effect, the present invention applies physical pressure to flatten a surface layer on a semiconductor workpiece; static pressures or dynamic pressures may be applied.

The present invention is particularly adapted for use in planarizing surface layers made of plastic materials. For example, the planarization of plastic materials, such as interlayer dielectrics, may be achieved through practice of the present invention. The required physical pressure may be applied in a variety of different ways. For example, physical pressure may be applied by pressing with a heated metal plate. A roller or tilted metallic plate may also be used to apply pressure to a surface layer. Alternatively, static pressure from liquid or gas phase processes may be used to planarize a surface layer made of plastic materials.

Broadly, the present invention is directed to a semiconductor workpiece processing method comprised of a plurality of steps. This method is applicable to any electronic device in which it is desired to have a planar surface overlie a workpiece surface. First, a semiconductor workpiece is provided. The semiconductor workpiece may comprise a substrate with multiple layers of insulators, conductors, or semiconductors applied thereto. These layers may vary in topography, height and width, and may be applied to the workpiece in accordance with conventional semiconductor fabrication techniques. For example, a lamination process may be used in the formation of these layers, whereby a prepared thin film is spread on the substrate in a vacuum. Each layer of surface material has an upper surface and a lower surface. The upper surface of a particular layer of surface material may be planarized in accordance with the present invention. Physical pressure is applied against the upper surface of the layer of surface material. This process planarizes the upper surface of the layer of surface material. The layer of surface material may also be heated during application of the physical pressure.

In a more specific embodiment of the present invention, a method of planarizing a semiconductor workpiece surface is provided. This planarization method may be utilized in carrying out a semiconductor workpiece processing method. In this regard, a semiconductor workpiece is provided, and a layer of surface material is applied thereto in a conventional manner. This layer of surface material has upper and lower surfaces, and the upper surface is planarized according to the present invention. A means for applying pressure is provided. This means for applying pressure may be preheated to an elevated temperature. The semiconductor workpiece surface is then contacted with this heated means for applying pressure, such as by moving the heated means for applying pressure into contact with the semiconductor workpiece surface. Next, the means for applying pressure is heated to a further elevated temperature while it is in contact with the semiconductor workpiece surface. The combined pressure and heat thereby planarize the semiconductor workpiece surface. The precise values for the time, pressure, and temperature parameters of the planarizing process may be varied accordingly as will be appreciated by those of ordinary skill in the art. It is noted that the layer of surface material may also be heated prior to contact with the means for applying pressure.

The method of the present invention may be carried out using a variety of different means for applying pressure. For example, the means for applying pressure may comprise a metallic plate having upper and lower surfaces, with the lower surface of the metallic plate moved into contact with the semiconductor workpiece surface. The metallic plate may have apertures disposed therein, such that excess material from the semiconductor workpiece surface flows through the apertures when the metallic plate is in contact with the workpiece surface. This lower surface of the metallic plate may also be patterned. Alternatively, the means for applying pressure may take the form of a roller or a tilted metallic plate which may be moved across the layer of surface material to thereby planarize the surface layer. A metallic plate or roller used in accordance with the present invention may be coated with a layer of non-stick material, such as a silicone or a fluorocarbon material. Finally, it is envisioned that the means for applying pressure may also take the form of static pressures provided by liquid or gas phase processes.

The present invention is particularly adapted for use on semiconductor workpiece surfaces which are comprised of plastic materials, such as dielectrics. Surface layers comprised of materials containing silicon dioxide, such as spin-on-glass (SOG), and doped silicon dioxide materials such as phosphorous silicate glass (PSG) and borophosphorous silicate glass (BPSG), are well-suited for carrying out the method of the present invention. The method of the present invention may also be used when the semiconductor workpiece surface is comprised of a metallic material such as copper or aluminum, a semiconductor material, or a field oxide.

BRIEF DESCRIPTION OF THE DRAWINGS

The novel features of the invention are set out with particularity in the appended claims, but the invention will be understood more fully and clearly from the following detailed description of preferred embodiments of the invention as set forth in the accompanying drawings, in which:

DETAILED DESCRIPTION OF THE INVENTION

The preferred embodiment of the present invention will be described in connection with a particular semiconductor workpiece comprising a silicon dioxide insulating layer or dielectric layer applied over a conductive layer, such as a metallization layer. While exemplary of the present invention, it should be understood that this is not the only configuration which may be used in carrying out the present invention. Other conventional materials may be used. For example, conventional dielectric materials, such as silicon nitride, silicone oxynitride, polyimides, and the like, may also serve as the insulating material, while the underlying topographic irregularities may result from various surface features, including transistors and other devices, as well as the conductive layer. Further, the method of the present invention may be employed at any time a planarized surface is desired, whether the surface layer is comprised of an insulating material, conducting material, or semiconducting material. Most commonly, however, the method of the present invention will be carried out when an insulating layer or dielectric is applied over an irregular surface, e.g., a conductive layer. Finally, it should be understood that the method of the present invention may be employed two or more times during the fabrication of a particular integrated circuit on a wafer.

Figure 2:
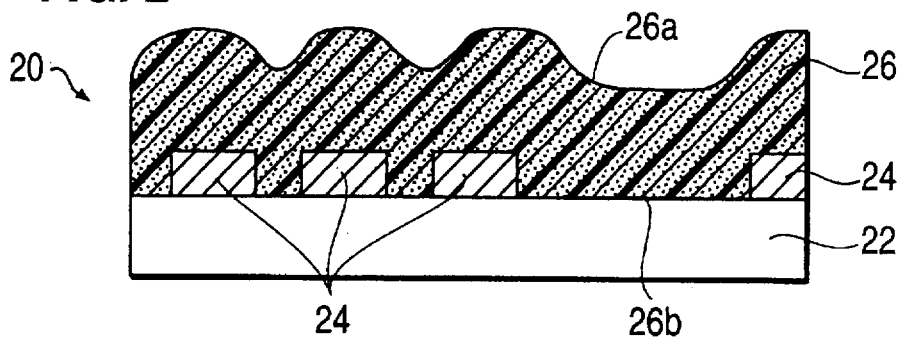
FIG. 2 is a cross-sectional view of a semiconductor workpiece which may be used in carrying out the method of the present invention.

A semiconductor workpiece 20 which may be used in practicing the present invention is shown in FIG. 2. The workpiece 20 shown in FIG. 2 is for illustrative purposes only, and the actual workpiece used in carrying out the present invention may vary in topography, height and width. A particular workpiece used in carrying out the method of the present invention may include multiple levels of insulators, such as oxide or nitride, and multiple levels of conductors, such as metal or doped polysilicon. The present invention is broadly applicable to any electronic device in which it is desired to have a planar surface overlie a particular workpiece.

The semiconductor workpiece 20 shown in FIG. 2 includes a conventional substrate 22 and several stacked regions 24. These stacked regions 24 represent topographic irregularities which result when various features are applied to the wafer surface. For example, these stacked regions 24 may represent metal interconnections formed on the substrate surface by reactive ion etching (RIE). A layer of surface material 26 is applied over the substrate 22 and stacked regions 24 in a conventional manner. This layer of surface material may comprise, for example, a material containing silicon dioxide, such as spin-on-glass (SOG).

Figure 4:
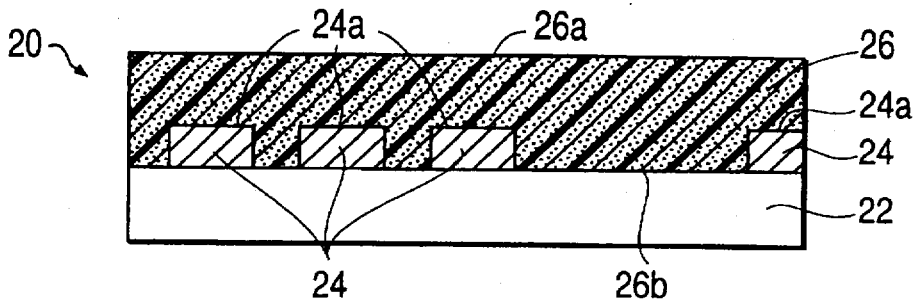
FIG. 4 is a cross-sectional view of a semiconductor workpiece after performance of the method of the present invention.

The present invention is broadly directed to a method of processing the semiconductor workpiece 20. The layer of surface material 26 has an upper surface 26a and a lower surface 26b. The upper surface 26a of this layer of surface material 26 may be planarized in accordance with the present invention. In this regard, physical pressure is applied against the upper surface 26a of the layer of surface material 26. This process planarizes the upper surface 26a of the layer of surface material 26 to produce a planarized semiconductor workpiece surface as shown in FIG. 4. Physical pressure is provided by a means for applying pressure. This means for applying pressure may take the form of a metallic plate pressed against the layer of surface material, or a tilted metallic plate or roller may be moved across the layer of surface material to provide physical pressure. Alternatively, physical pressure may be applied via liquid or gas phase processes. The physical pressure may be applied in conjunction with heat treatment of the layer of surface material 26.

Figure 3:
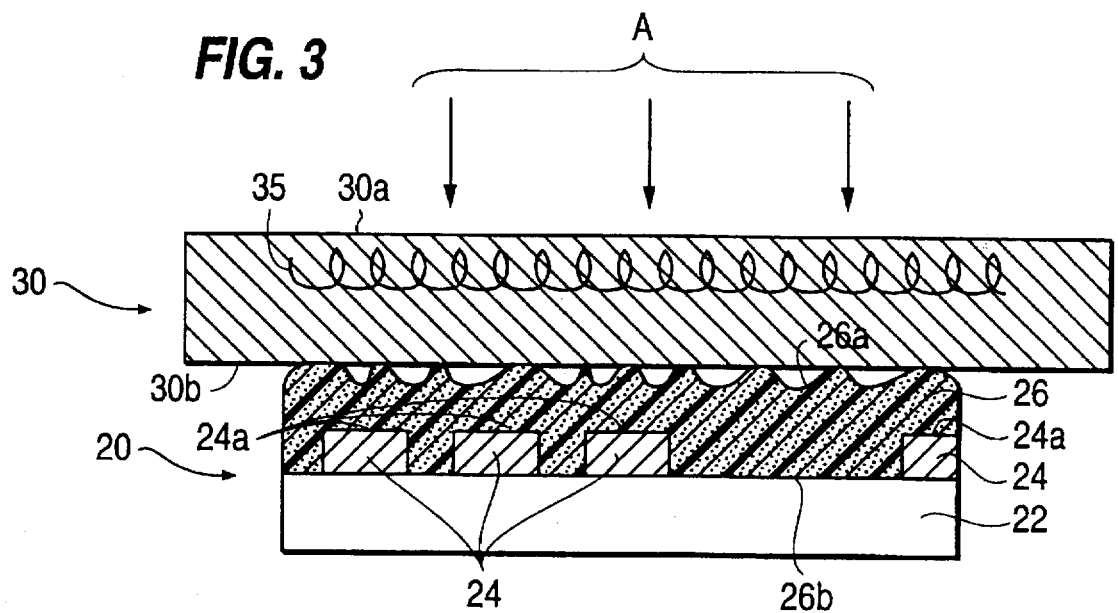
FIG. 3 is a cross-sectional view illustrating one form of the method of the present invention being carried out on a semiconductor workpiece.
Figure 12:
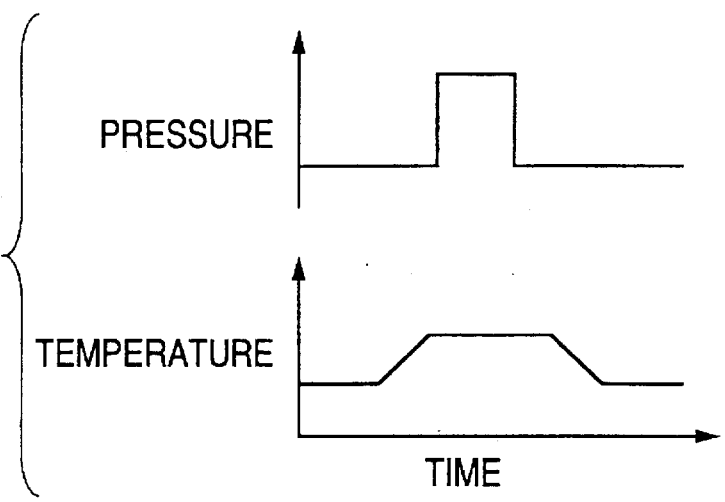
FIGS. 12–14 illustrate potential planarizing patterns which may be used in carrying out the method of the present invention.
Figure 13:
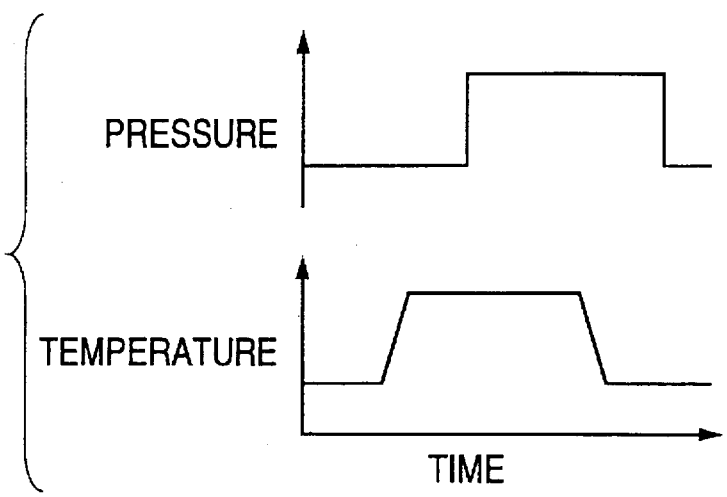
Figure 14:
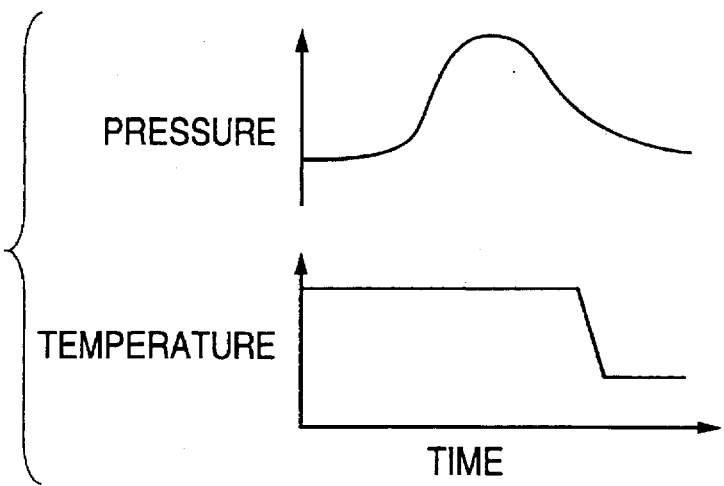

A more specific form of the method of planarizing a semiconductor workpiece surface according to the present invention is shown in FIG. 3. A planarization method is provided for a semiconductor workpiece 20 having a layer of surface material 26 applied thereto as shown in FIG. 2. Again, the layer of surface material 26 has upper 26a and lower 26b surfaces, and the upper surface 26a is planarized according to the present invention. A means for applying pressure 30 is provided. This means for applying pressure 30 may be pre-heated to an elevated temperature. The semiconductor workpiece surface 26a is then contacted with this heated means for applying pressure 30, such as by moving the heated means for applying pressure 30 into contact with the semiconductor workpiece surface as shown by arrows A in FIG. 3. Next, the means for applying pressure 30 is heated to a further elevated temperature while it is in contact with the semiconductor workpiece surface 26a. As shown by FIG. 4, the combined pressure and heat thereby planarize the semiconductor workpiece surface 26a. The precise values for the time, pressure, and temperature parameters of the planarizing process may be varied accordingly as will be appreciated by those of ordinary skill in the art. FIGS. 12–14 are merely exemplary of possible planarizing patterns which may be utilized in carrying out the present invention. It should be noted that the layer of surface material 26 may also be heated in a conventional manner prior to contact with the means for applying pressure 30. This pre-heat treatment may aid in the planarization of the upper surface 26a of the layer of surface material 26.

The means for applying pressure 30 may take a variety of forms well known to those of ordinary skill in the art. For example, as shown in FIG. 3, the means for applying pressure 30 may comprise a flat metallic plate having upper 30a and lower 30b surfaces, with the lower surface 30b of the metallic plate moved into contact with the upper semiconductor workpiece surface 26a. The means for applying pressure 30 shown in FIG. 4 may also comprise a roller or a metallic plate which may be tilted. In accordance with the present invention, the lower surface of such a roller or tilted metallic plate is moved across the layer of surface material and thereby planarizes the surface layer. The means for applying pressure 30 should be capable of being heated, and may be provided, for example, with an electrical element or elements 35 as shown in FIG. 3.

As noted, the means for applying pressure 30 may take the form of a flat metallic plate, tilted metallic plate or roller. If a metallic plate or roller is indeed used as the means for applying pressure 30, the lower surface of the metallic plate or roller may advantageously be coated with a layer of non-stick material, such as a silicone or a fluorocarbon material. The use of such a non-stick material helps to ensure that surface layer material does not bind to the metallic plate or roller when it is removed from contact with the semiconductor workpiece surface.

The means for applying pressure may also take the form of static pressures from liquid or gas phase processes. For example, a semiconductor workpiece having an upper surface which is to be planarized may be placed in a closed vessel filled with liquid at a predetermined temperature. The pressure within the vessel may then be increased in a manner known to those of ordinary skill in the art. The resulting change in the internal pressure of the vessel affects the pressure along the surface of the semiconductor workpiece. Accordingly, a change in pressure may be suitably effected to thereby planarize the upper surface of the workpiece. The various processing parameters utilized in carrying out the increase in pressure of the liquid within the vessel will be appreciated by those of ordinary skill in the art.

A gas phase process may similarly be used to apply physical pressure in carrying out the method of the present invention. The semiconductor workpiece is placed in a closed vessel filled with a gas at a predetermined pressure and temperature. The pressure of the gas may then be increased, for example, by the inflow of gas at a higher pressure. The temperature of the gas within the vessel may also then be increased. In essence, the increased pressure and temperature within the vessel effectuates an increase in the pressure at the surface of the semiconductor workpiece. This physical pressure may be used to planarize the upper surface of the semiconductor workpiece. Again, the various processing parameters utilized for the temperature and pressure of the gas within the vessel will be appreciated by ordinarily skilled artisans.

Figure 1:
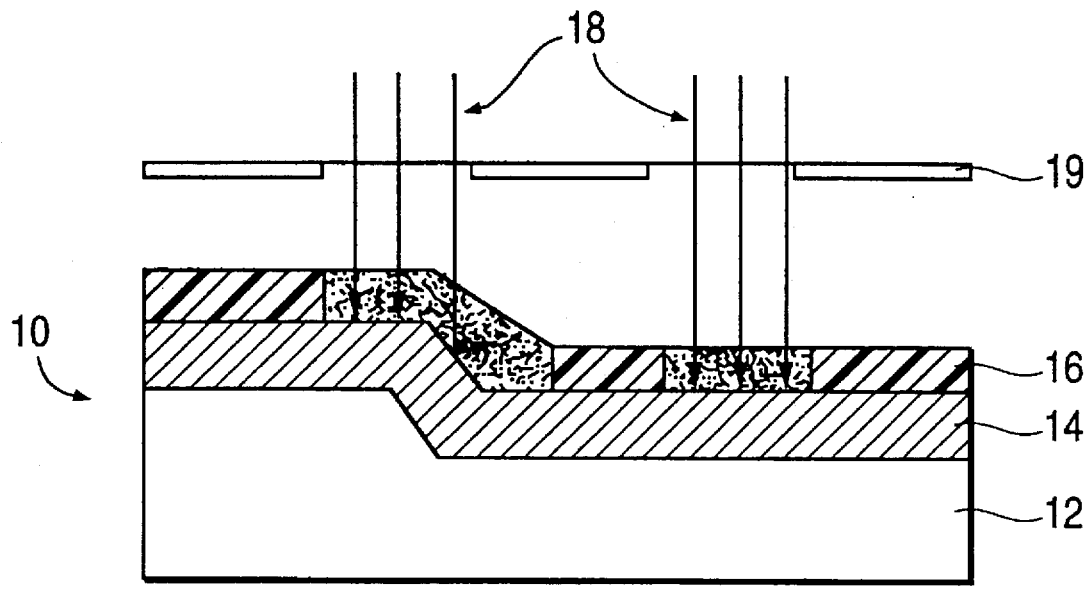
FIG. 1 is a cross-sectional view of a prior art semiconductor workpiece undergoing a photolithographic process.
Figure 5:
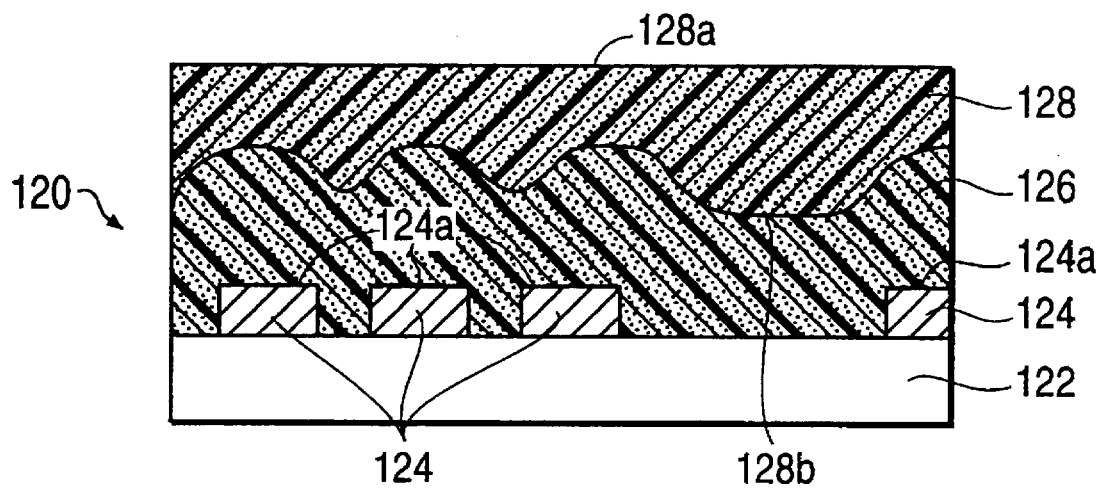
FIG. 5 is a cross-sectional view illustrating an alternative semiconductor workpiece after performance of the method of the present invention.

FIG. 5 shows one alternative semiconductor workpiece 120 configuration which may similarly utilize the method of the present invention. In this embodiment, the semiconductor workpiece 120 includes a conventional substrate 122 and several stacked regions 124. A layer of surface material 126 is applied over the substrate 122 and stacked regions 124. Again, this layer of surface material may comprise, for example, a material containing silicon dioxide such as spin-on-glass (SOG). With this embodiment, an additional layer of surface material 128 is applied over the first layer of surface material 126. This additional layer of surface material 128 includes upper and lower surfaces 128a, 128b. The planarization method of the present invention is carried out by contacting the lower surface 30b of the means for applying pressure 30 with the upper surface 128a of the additional layer of surface material 128. Heat treatment of the means for applying pressure 30 and the additional layer of material 128 may be performed as desired.

Preferably, the additional layer of material 128 is a field oxide. A field oxide will desirably have a low flow rate when heated. This enables the method of the present invention to achieve even greater planarization of the semiconductor workpiece surface. However, a field oxide has poor electrical characteristics. Thus, in utilizing the configuration of FIG. 5, the present invention takes advantage of the flow characteristics of the field oxide in planarizing the surface, but does not sacrifice the electrical capabilities of the workpiece because a first layer of surface material is also provided.

Notably, the upper surface of the layer of surface material which is desired to be planarized may be fully planar or may also be stepped. More specifically, the upper surface of the layer of surface material may extend fully across the workpiece or workpiece surface as shown at 26, 128 in FIGS. 4 and 5. In this situation, the upper surface 26a, 128a of the layer of surface material is fully planar. Alternatively, however, the present invention may also be utilized to planarize a stepped upper surface of the layer of surface material. For example, the method of the present invention could be utilized to planarize the upper surface 24a, 124a of the layer of surface material represented by the stacked regions 24, 124 shown in FIGS. 4 and 5. In this regard, the method of the present invention provides for the planarization of the upper surfaces of each of the respective stacked regions 24, 124 which collectively form a stepped upper surface 24a, 124a of a layer of surface material. Of course, this planarization would take place prior to the application of additional layers of surface material 26, 126 or 128.

Figure 6:
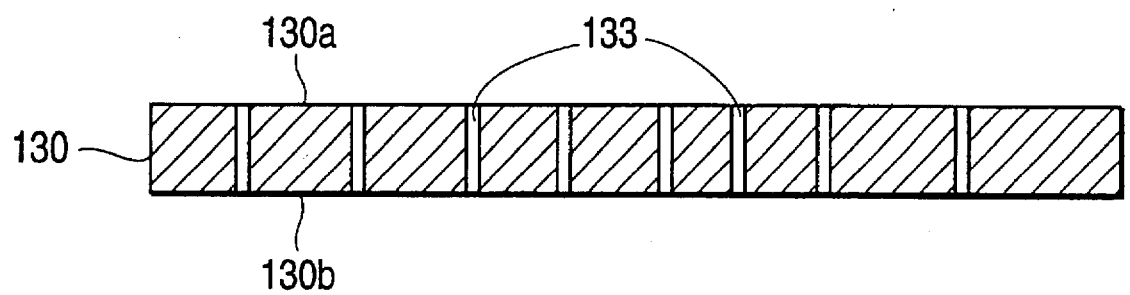
FIG. 6 is a cross-sectional view of one form of a means for applying pressure which may be used in carrying out the method of the present invention.
Figure 7:
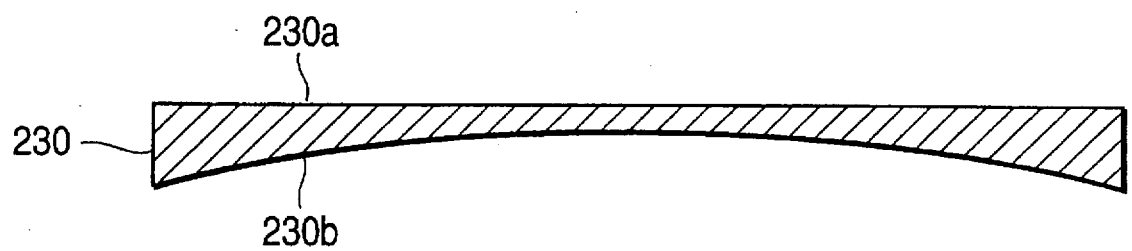
FIG. 7 is a cross-sectional view of a second form of a means for applying pressure which may be used in carrying out the method of the present invention.
Figure 8:
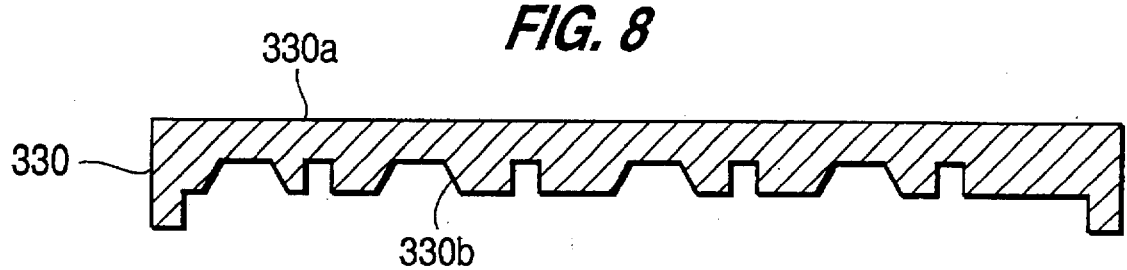
FIG. 8 is a cross-sectional view of a third form of a means for applying pressure which may be used in carrying out the method of the present invention.

Further, FIGS. 6–8 illustrate several potential embodiments of a metallic plate which may be used in carrying out the method of the present invention. As shown in FIG. 6, a metallic plate 130 having upper and lower surfaces 130a, 130b may be provided. This metallic plate 130 may have apertures 133 disposed therein, such that excess material from the layer of surface material flows through the apertures 133 when the metallic plate 130 is in contact with the workpiece surface. This configuration contributes to a more complete planarization of the layer of surface material.

Alternatively, a metallic plate 230 having upper and lower surfaces 230a, 230b may be used as shown in FIG. 7. With this configuration, the lower surface 230b of the metallic plate 230 may be patterned to have a certain concavity or bowing shape. The pattern of the lower surface 230b of the metallic plate 230 will be formed on the semiconductor workpiece surface when the planarization method of the present invention is carried out. Thus, when using the metallic plate 230 of FIG. 7, an intentional non-uniformity in thickness may be created across the layer of surface material applied to the semiconductor workpiece.

FIG. 8 shows a metallic plate 330 having upper and lower surfaces 330a, 330b which may alternatively be used to carry out the method of the present invention. With this configuration, the lower surface 330b of the metallic plate 330 is patterned with a plurality of extensions and indentations. When using the metallic plate 330 of FIG. 8 to carry out the method of the present invention, intentional convexities may be created across the layer of surface material applied to the semiconductor workpiece.

Figure 9:
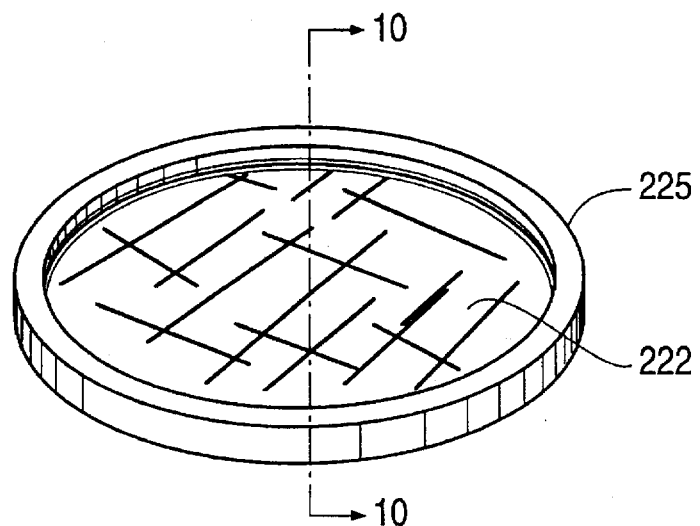
FIG. 9 is a perspective view of the substrate of a semiconductor workpiece which may be used in carrying out the method of the present invention.
Figure 10:
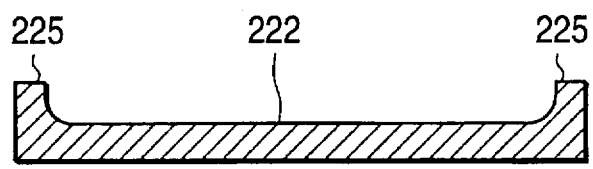
FIG. 10 is a cross-sectional view along the line 10—10 in FIG. 9 showing a semiconductor workpiece which may be used in carrying out the method of the present invention.

A variety of substrate structures may be used in carrying out the method of the present invention. For example, the wafer-shaped substrate 222 of FIGS. 9 and 10 has a raised circular fringe 225 about its outer perimeter. This fringe 225 serves to maintain the applied layer of surface material, such as a layer of spin-on-glass (SOG), parallel with the standard level of the substrate 222.

Figure 11:
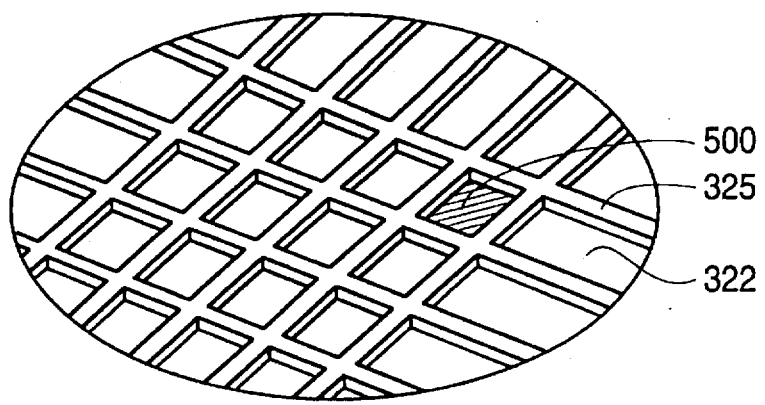
FIG. 11 is a perspective view of another substrate of a semiconductor workpiece which may be used in carrying out the method of the present invention.

Alternatively, a substrate 322 such as shown in FIG. 11 may be used in carrying out the method of the present invention. Integrated circuit manufacturers typically provide cutting space on the wafer surface so that individual chips 500 may be separated therefrom. To utilize this otherwise useless cutting space, fringe areas 325 similar to the circular fringe 225 described above may be provided along the cutting regions.

Further, the means for applying pressure 30 used in carrying out the present invention may be configured to correspond to such fringes 225, 325. For example, a metallic plate to be used in carrying out the method of the present invention could be configured to have a circular fringe similar to that shown in FIG. 9. In this manner, when the metallic plate is brought into contact with the layer of surface material, the fringe on the metallic plate would help to maintain the surface material at a standard level.

The present invention is particularly adapted for use in planarizing semiconductor surface layers which are comprised of plastic materials, such as dielectrics. Surface layers comprised of materials containing silicon dioxide, such as spin-on-glass (SOG), and doped silicon dioxide materials such as phosphorous silicate glass (PSG) and borophosphorous silicate glass (BPSG), are well-suited for carrying out the method of the present invention. However, the method of the present invention may also be carried out when it is desired to planarize a surface layer which is comprised of a metallic material such as aluminum or copper, a semiconductor material, or a field oxide.

EXAMPLE 1

In an exemplary embodiment of the present invention, the semiconductor workpiece 20 includes a conventional substrate 22 and several stacked regions 24 as shown in FIG. 2. These stacked regions 24 represent metal interconnections formed on the substrate surface by reactive ion etching (RIE). The metal interconnections have a height of 0.4 μm and a width of 0.3 μm. layer of surface material 26 is applied over the substrate 22 and stacked regions 24. This layer of surface material 26 comprises a 0.6 μm silanol type spin-on-glass (SOG). After the layer of surface material 26 is applied, the spin-on-glass (SOG) material is heated at 120° C. in order to evaporate a part of the solvent in the spin-on-glass (SOG) solution. This heat treatment may be carded out in any conventional manner known to those of ordinary skill in the art. At this point, as shown in FIG. 2, the upper surface 26a of the layer of surface material retains a slightly non-planar shape corresponding to the underlying topographical irregularities. When heated in accordance with the present invention, the spin-on-glass (SOG) material retains its flowable, plastic-like tendency, but the surface tension along the upper surface 26b of the layer of surface material 26 is balanced at this time.

Next, a means for applying pressure 30 is provided. This means for applying pressure preferably takes the form of a flat metallic plate, but may also be tilted metallic plate or roller. The flat metallic plate is heated at 120° C., and moved into contact with the upper surface 26a of the layer of spin-on-glass (SOG) material as shown in FIG. 2. The metallic plate presses the semiconductor workpiece surface, and reforms the layer of spin-on-glass (SOG) material. The pressure on the semiconductor workpiece surface is maintained at 35 pounds per square inch. After twenty seconds of continued pressure on the layer of surface material 26, the temperature of the metal plate is increased to 350° C. The upper surface 26a of the layer of spin-on-glass (SOG) material 26 is thus cured and hardened. When the metallic plate is moved out of contact with the semiconductor workpiece, the upper surface 26a of the layer of surface material 26 has an absolute planarity and a completely smooth surface.

EXAMPLE 2

In another exemplary embodiment of the present invention, the semiconductor workpiece 20 again includes a conventional substrate 22 and several stacked regions 24 as shown in FIG. 2. A layer of surface material 26 is applied over the substrate 22 and stacked regions 24. As shown in FIG. 2, the upper surface 26a of the layer of surface material has a slightly non-planar shape which must be planarized. A means for applying pressure to the upper surface 26a of the layer of surface material is provided. This means for applying pressure takes the form of physical pressure from a liquid phase process.

Figure 15:
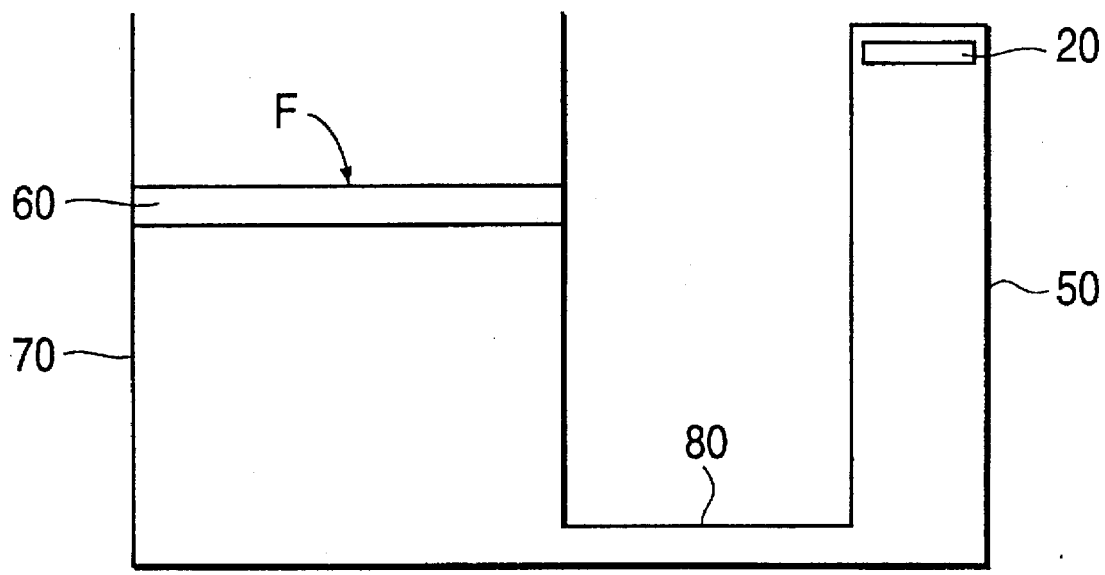
FIGS. 15–16 illustrate additional embodiments of a means for applying pressure which may be used in carrying out the method of the present invention.

As shown in FIG. 15, the semiconductor workpiece 20 is placed in a closed vessel 50 having a 10" diameter. The vessel 50 is filled with silicone oil at a temperature of 350° C. The pressure within the vessel 50 is then increased, for example, by use of the piston 60 and cylinder 70 arrangement shown in FIG. 15. The piston 60 and cylinder 70 are connected to the vessel through a suitable connection means 80, and a force F is applied to the piston 60. The pressure of the silicone oil within the vessel 50 is thereby significantly increased in accordance with Pascal's Law. This relationship may be shown as follows:

$$\frac{\text{Pressure}(v)}{\text{Pressure}(p)} = \frac{\text{Area}(v)}{\text{Area}(p)}$$

where Pressure (v) represents the pressure within the vessel, Pressure (p) represents the pressure at the piston, Area (v) represents the cross-sectional area of the vessel, and Area (p) represents the cross-sectional area of the piston. For example, if the piston 60 has a diameter of 32", and a force F of 50 pounds per square inch (psi) is applied thereto, the internal pressure of the silicone oil within the vessel may be found from the following equation:

$$\frac{\text{Pressure(vessel)}}{50 \text{p.s.i.}} = \frac{\pi * 32" * 32"}{\pi * 100" * 100"} \; ; \text{Pressure(vessel)} = 512 \text{p.s.i.}$$

By applying force F to the piston 60, the pressure within the vessel 50 is thereby significantly increased. This resulting change in the internal pressure of the vessel affects the pressure along the surface of the semiconductor workpiece. Accordingly, a change in pressure may be suitably effected to thereby planarize the upper surface of the workpiece. The various processing parameters utilized in carrying out the desired increase in pressure of the liquid within the vessel will be appreciated by those of ordinary skill in the art.

EXAMPLE 3

A gas phase process may similarly be used to apply physical pressure in carrying out the method of the present invention. Again, the semiconductor workpiece 20 includes a conventional substrate 22 and several stacked regions 24 as shown in FIG. 2. A layer of surface material 26 is applied over the substrate 22 and stacked regions 24. As shown in FIG. 2, the upper surface 26a of the layer of surface material has a slightly non-planar shape which must be planarized. A means for applying pressure to the upper surface 26a of the layer of surface material is provided.

Figure 16:
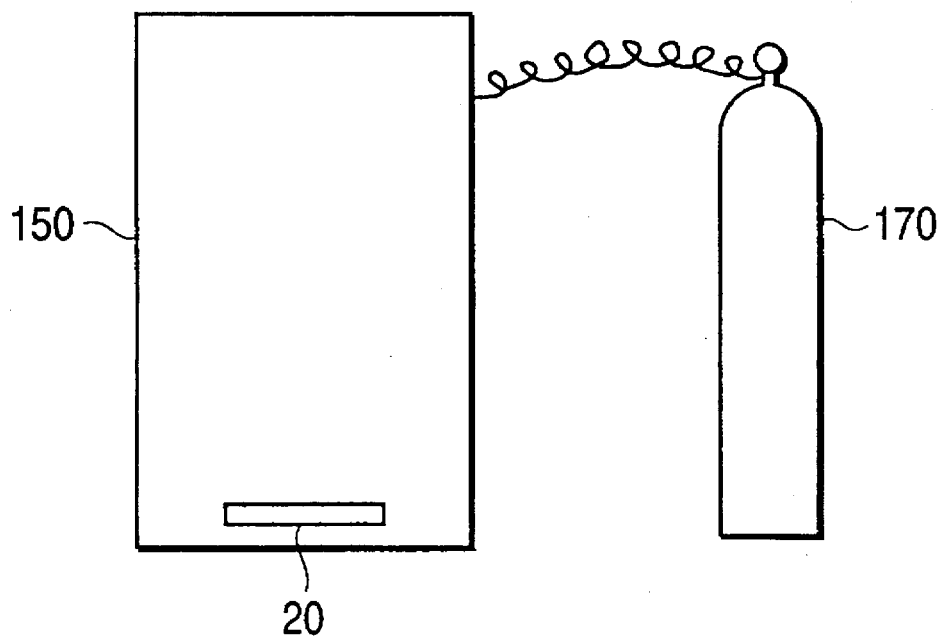

As shown in FIG. 16, the semiconductor workpiece 20 is placed in a closed vessel 150 filled with a gas at a predetermined pressure and temperature. For example, the vessel 150 may be maintained at a temperature of 100° C. and filled with helium held at 1 atmosphere. The pressure of the gas may then be increased to 10 atmospheres, for example, by the inflow of helium being held at the higher pressure in an adjacent tank 170. Next, the temperature of the helium within the vessel 150 may then be increased from 100° C. to 250° C. Physical pressure is thus applied to the surface of the semiconductor workpiece 20 via the higher pressure and temperature within the vessel 150. This physical pressure may be used to planarize the upper surface of the semiconductor workpiece 20. It is also possible to further raise the temperature to 350° C. to further stabilize and harden the upper surface of the semiconductor workpiece 20. Also, it is envisioned that the explosion of a reactive gas, for example $C_2H_2+O_2$, which causes volume expansion may be used to pressurize the gas within the vessel 150.

It can be seen that the present invention provides a simple, low cost planarization technique whereby physical pressure is used to reform and planarize the surface of a semiconductor device. The method of the present invention planarizes a semiconductor workpiece surface and results in an increase in the productivity of the processing steps that follow.

Many of the disadvantages of the prior art planarization techniques are overcome by the method of the present invention. For example, unlike CMP processes, a polishing pad is not used, and dishing of the workpiece surface is avoided. The present invention is also less time-intensive than the typical etchback or multi-layer resist processes. Further, with the prior art CMP and etchback techniques, it is difficult to maintain the final thickness of the wafer surface within the required narrow tolerance window. In using the method of the present invention, the final thickness of the planarized wafer surface may more easily be maintained within such a narrow tolerance window.

From the foregoing detailed description, it will be evident that there are a number of changes, adaptations and modifications of the present invention which come within the province of those skilled in the art. It is intended that all such variations not departing from the spirit of the invention be considered as within the scope thereof as expressed in the claims appended hereto.

What is claimed is:

1. A semiconductor workpiece processing method, comprising:
   providing a semiconductor workpiece;
   forming a layer of material on said semiconductor workpiece; and
   contacting a surface of said layer of material with a plate having apertures formed therein to apply pressure so as to planarize said surface of said layer of material,
   wherein excess material flows through said apertures when said plate contacts said surface of said layer of material.

2. The semiconductor workpiece processing method of clam 1, further comprising the step of heating said layer of material while said plate contacts said surface of said layer of material.

3. The semiconductor workpiece processing method of claim 1, further comprising the steps of
   pre-heating said plate before said plate contacts said surface of said layer of material, and
   further heating said plate while said plate contacts said surface of said layer of material.

4. The semiconductor workpiece processing method of claim 1, wherein a surface of said plate which contacts said surface of said layer of material is coated with a layer of non-stick material.

5. The semiconductor workpiece processing method of claim 4, wherein said non-stick material is a silicone material.

6. The semiconductor workpiece processing method of claim 4, wherein said non-stick material is a fluorocarbon material.

7. The semiconductor workpiece processing method of claim 1, wherein said layer of material is comprised of a dielectric material.

8. The semiconductor workpiece processing method of claim 1, wherein said layer of material is comprised of a material containing silicon dioxide.

9. The semiconductor workpiece processing method of claim 1 wherein said layer of material comprises spin-on-glass (SOG).

10. The semiconductor workpiece processing method of claim 1, wherein said layer of material is comprised of a doped silicon dioxide material.

11. The semiconductor workpiece processing method of claim 10, wherein said doped silicon dioxide material comprises phosphorous silicate glass (PSG).

12. The semiconductor workpiece processing method of claim 10, wherein said doped silicon dioxide material comprises borophosphorous silicate glass (BPSG).

13. The semiconductor workpiece processing method of claim 1, wherein said layer of material is comprised of a field oxide.

14. The semiconductor workpiece processing method of claim 1, wherein said layer of material is comprised of a metallic material.

15. The semiconductor workpiece processing method of claim 1, wherein said layer of material is comprised of a semiconductor material.

16. The semiconductor workpiece processing method of claim 1, wherein said plate is a metallic plate.

17. A method of planarizing a semiconductor workpiece surface comprising:

providing a plate having apertures formed therein;
pre-heating said plate to an elevated temperature;
contacting said semiconductor workpiece surface with said heated plate; and
further heating said plate to a further elevated temperature while said plate contacts said semiconductor workpiece surface so as to planarize said semiconductor workpiece surface,
wherein excess surface material of said semiconductor workpiece surface flows through said apertures when said plate contacts said semiconductor workpiece surface.

18. The method of planarizing a semiconductor workpiece surface of claim 17, wherein a surface of said plate which contacts said semiconductor workpiece surface is coated with a layer of non-stick material.

19. The method of planarizing a semiconductor workpiece surface of claim 18, wherein said non-stick material comprises a silicone material.

20. The method of planarizing a semiconductor workpiece surface of claim 18, wherein said non-stick material comprises a fluorocarbon material.

21. The method of planarizing a semiconductor workpiece surface of claim 17, wherein said semiconductor workpiece surface is comprised of a dielectric material.

22. The method of planarizing a semiconductor workpiece surface of claim 17, wherein said semiconductor workpiece surface is comprised of a material containing silicon dioxide.

23. The method of planarizing a semiconductor workpiece surface of claim 17, wherein said semiconductor workpiece surface comprises spin-on-glass (SOG).

24. The method of planarizing a semiconductor workpiece surface of claim 17, wherein said semiconductor workpiece surface is comprised of a doped silicon dioxide material.

25. The method of planarizing a semiconductor workpiece surface of claim 24, wherein said doped silicon dioxide material comprises phosphorous silicate glass (PSG).

26. The method of planarizing a semiconductor workpiece surface of claim 24, wherein said doped silicon dioxide material comprises borophosphorous silicate glass (BPSG).

27. The method of planarizing a semiconductor workpiece surface of claim 17, wherein said semiconductor workpiece surface is comprised of a field oxide.

28. The method of planarizing a semiconductor workpiece surface of claim 17, wherein said semiconductor workpiece surface is comprised of a metallic material.

29. The method of planarizing a semiconductor workpiece surface of claim 17, wherein said semiconductor workpiece surface is comprised of a semiconductor material.

30. The method of planarizing a semiconductor workpiece surface of claim 17, wherein said heated plate is moved into contact with said semiconductor workpiece surface.

31. The method of planarizing a semiconductor workpiece surface of claim 17, wherein said plate is a metallic plate.

* * * * *